(12) United States Patent
Huang et al.

(10) Patent No.: US 12,119,426 B2
(45) Date of Patent: *Oct. 15, 2024

(54) LIGHT EMITTING DEVICE AND PRODUCTION METHOD THEREOF

(71) Applicant: XIAMEN SAN'AN OPTOELECTRONICS TECHNOLOGY CO., LTD., Xiamen (CN)

(72) Inventors: Shaohua Huang, Xiamen (CN);
Xiaoqiang Zeng, Xiamen (CN);
Canyuan Zhang, Xiamen (CN);
Jianfeng Yang, Xiamen (CN)

(73) Assignee: QUANZHOU SAN'AN SEMICONDUCTOR TECHNOLOGY CO., LTD., Nanan (CN)

( * ) Notice: Subject to any disclaimer, the term of this patent is extended or adjusted under 35 U.S.C. 154(b) by 625 days.

This patent is subject to a terminal disclaimer.

(21) Appl. No.: 17/301,578

(22) Filed: Apr. 8, 2021

(65) Prior Publication Data
US 2021/0226089 A1    Jul. 22, 2021

Related U.S. Application Data

(63) Continuation-in-part of application No. PCT/CN2018/109911, filed on Oct. 11, 2018.

(51) Int. Cl.
*H01L 33/00* (2010.01)
*H01L 33/14* (2010.01)
(Continued)

(52) U.S. Cl.
CPC ............ *H01L 33/14* (2013.01); *H01L 33/005* (2013.01); *H01L 33/20* (2013.01); *H01L 33/382* (2013.01)

(58) Field of Classification Search
CPC ..... H01L 33/20; H01L 33/382; H01L 33/642; H01L 2933/0016; H01L 2933/0075
See application file for complete search history.

(56) References Cited

U.S. PATENT DOCUMENTS

| 2018/0254384 A1* | 9/2018 | Hartmann | H01L 33/387 |
| 2021/0226088 A1* | 7/2021 | Zhang | H01L 27/153 |

FOREIGN PATENT DOCUMENTS

| CN | 102005465 A | 4/2011 |
| CN | 103855180 A | 6/2014 |
| CN | 106409997 A | 2/2017 |

OTHER PUBLICATIONS

Search Report issued to PCT application No. PCT/CN2018/109911 by the WIPO on Jul. 17, 2019.
(Continued)

*Primary Examiner* — Reema Patel
(74) *Attorney, Agent, or Firm* — Muncy, Geissler, Olds & Lowe, P.C.

(57) ABSTRACT

A light emitting device includes at least one light emitting unit that includes an insulating layer, a first electrically conductive layer, and a semiconductor layer structure having at least one recess. The first electrically conductive layer and the insulating layer extend into the recess. A contact area between a conductive protrusion portion of the first electrically conductive layer and a first-type semiconductor layer of the semiconductor layer structure is larger than 1.5% of an area of a bottom surface of the first-type semiconductor layer. A method for producing the light emitting device is also disclosed.

15 Claims, 11 Drawing Sheets

(51) Int. Cl.
*H01L 33/20* (2010.01)
*H01L 33/38* (2010.01)

(56) References Cited

OTHER PUBLICATIONS

Search Report issued to Chinese counterpart application No. 201880003917.3 by the CNIPA on Dec. 16, 2020 with an English translation thereof.

* cited by examiner

LIGHT EMITTING DEVICE AND PRODUCTION METHOD THEREOF

CROSS-REFERENCE TO RELATED APPLICATION

This application is a bypass continuation-in-part application of International Application NO. PCT/CN2018/109911 filed on Oct. 11, 2018, the entire content of which is incorporated herein by reference.

FIELD

The disclosure relates to a light emitting device and a production method thereof, and more particularly to a high-voltage light emitting device and a production method thereof.

BACKGROUND

High-power and high-brightness light emitting diodes (LEDs) are important due to the great demand thereof in the market. Regarding horizontal LEDs having a sapphire substrate, since such sapphire substrate has poor heat dissipation efficiency and incurs a current crowding effect, the horizontal LEDs might be unable to dissipate heat and cause LED chips to burn upon operation under a high current density, indicating that high-power LEDs cannot adopt a horizontal structure.

Turning to vertical LEDS, since the substrate thereof may be made from a thermally conductive material with better heat dissipation efficiency (e.g. Si, CuW, etc.), and since the vertical LEDs are less likely to incur a current crowding effect, currents can be effectively spread. Therefore, the vertical LEDs can serve as high-power and high-brightness LEDs upon operation under a very high current density (e.g. 2.5 A/mm$^2$ and higher). However, it is still necessary to improve the vertical LEDs on current spreading and luminance for such LEDs to be able to serve as more satisfactory high-power and high-brightness LEDs.

In addition, high-power and high-brightness LEDS normally have other problems such as difficulty in wire bonding due to the complicated electrode design thereof, trouble in concentrating light emitted and resultant negative influence on luminance, and so forth.

SUMMARY

Therefore, an object of the disclosure is to provide a light emitting device and a production method thereof which can alleviate at least one of the drawbacks of the prior art.

The light emitting device includes a supporting substrate, at least one light emitting unit including a first electrically conductive layer, a second electrically conductive layer, a first electrode, and a second electrode. The light emitting unit includes the first electrically conductive layer, an insulating layer, and a semiconductor layer structure. The first electrically conductive layer has a conductive base portion that is disposed on the supporting substrate, and a conductive protrusion portion that extends from the conductive base portion away from the supporting substrate. The insulating layer has an insulating base portion that is disposed on the first electrically conductive layer opposite to the supporting substrate, and an insulating protrusion portion that extends form the insulating base portion away from the supporting substrate. The insulating protrusion portion surrounds the conductive protrusion portion of the first electrically conductive layer. The semiconductor layer structure is disposed on the insulating layer and the first electrically conductive layer opposite to the supporting and includes a first-type semiconductor layer, an active layer, and a second-type semiconductor layer. The second-type semiconductor layer, the active layer, and the first-type semiconductor layer are sequentially disposed on the insulating base portion of the insulating layer in such order. The semiconductor layer structure has at least one recess that extends from the second-type semiconductor layer through the active layer to the first-type semiconductor layer. The conductive protrusion portion of the first electrically conductive layer and the insulating protrusion portion of the insulating layer extend into the recess. The conductive protrusion portion of the first electrically conductive layer is disposed in contact with a bottom surface of the first-type semiconductor layer facing toward the supporting substrate. The second electrically conductive layer is disposed on the insulating base portion of the insulating layer opposite to the first electrically conductive layer. The second electrically conductive layer is electrically connected with the semiconductor layer structure. The first electrode is electrically connected to the first electrically conductive layer. The second electrode is electrically connected to the second electrically conductive layer. A contact area between the conductive protrusion portion of the first electrically conductive layer and the first-type semiconductor layer is larger than 1.5% of an area of the bottom surface of the first-type semiconductor layer.

The production method includes the following steps. At least one semiconductor layer structure is formed on a growth substrate. The semiconductor layer structure includes a first-type semiconductor layer, an active layer, and a second-type semiconductor layer that are sequentially formed on the growth substrate in such order. At least one recess is formed in the semiconductor layer structure, such that the recess extends from the second-type semiconductor layer through the active layer to the first-type semiconductor layer. A first electrically conductive layer is partially formed over the second-type semiconductor layer opposite to the active layer and outside the recess. A second electrically conductive layer is formed outside the recess and opposite to the growth substrate. The second electrically conductive layer is formed to be electrically connected with the semiconductor layer structure. An insulating layer is formed over the first electrically conductive layer and optionally over the second electrically conductive layer, and is formed in the recess such that the insulating layer is disposed over a bottom surface of the first-type semiconductor layer and inner lateral surfaces of the active layer and the second-type semiconductor layer. The bottom surface of the first-type semiconductor layer faces away from the growth substrate. The inner lateral surface of the active layer extends from the bottom surface of the first-type semiconductor layer, and the inner lateral surface of the second-type semiconductor layer extends from the inner lateral surface of the active layer. Parts of the insulating layer over the bottom surface of the first-type semiconductor layer and the first electrically conductive layer are removed to partially expose the first-type semiconductor layer and the first electrically conductive layer, such that the insulating layer has an insulating base portion and an insulating protrusion portion extending from the insulating base portion into the recess. The first electrically conductive layer is extended to completely f m the same, such h that the first electrically conductive layer has a conductive base portion that is formed over the insulating base portion of the insulating layer, and a conductive protrusion portion that extends from the conductive base portion into the recess to be disposed in contact with the bottom surface of the first-type semiconductor layer. The insulating protrusion portion of the insulating layer surrounds the conductive protrusion portion. A supporting substrate is disposed on the conductive base portion of the first electrically conductive layer. The growth substrate is removed. The semiconductor layer structure is partially removed such that the first electrically conductive layer and the second electrically conductive layer are partially exposed, and such that a contact area between the conductive protrusion portion of the first electrically conductive layer and the first-type semiconductor layer is larger than 1.5% of an area of the bottom surface of the first-type semiconductor layer. A first electrode is formed such that the first electrode is electrically connected to the first electrically conductive layer. A second electrode is formed such that the second electrode is electrically connected to the second electrically conductive layer.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
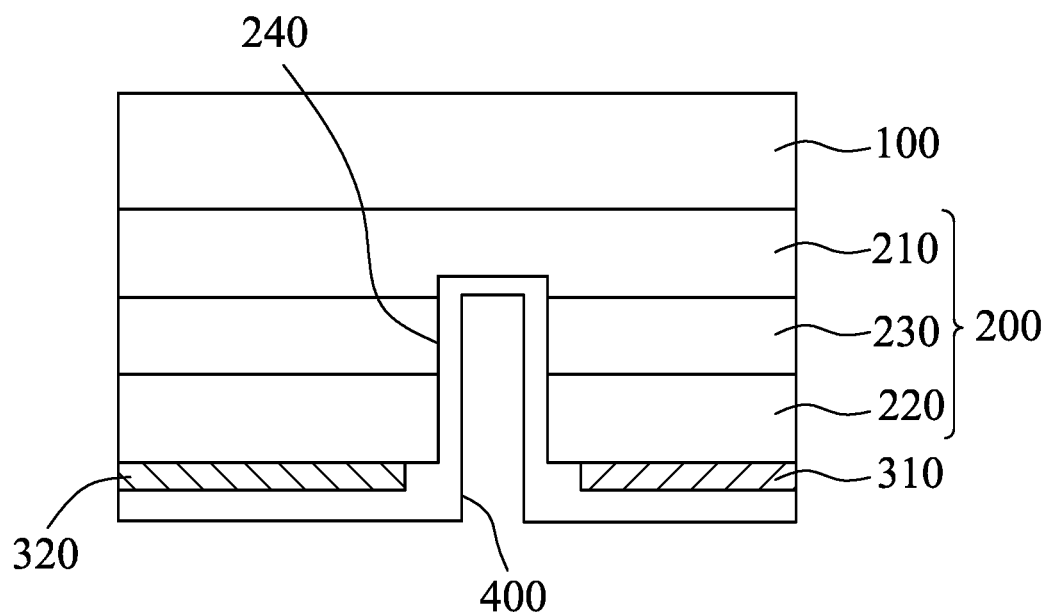
FIGS. 1 to 4 are schematic sectional views illustrating steps 1 to 7 of a first embodiment of a method for producing a light emitting device according to the present disclosure.

Before the disclosure is described, it should be noted that where considered appropriate, reference numerals or terminal portions of reference numerals have been repeated among the figures to indicate corresponding or analogous elements, which may optionally have similar characteristics.

Figure 5:
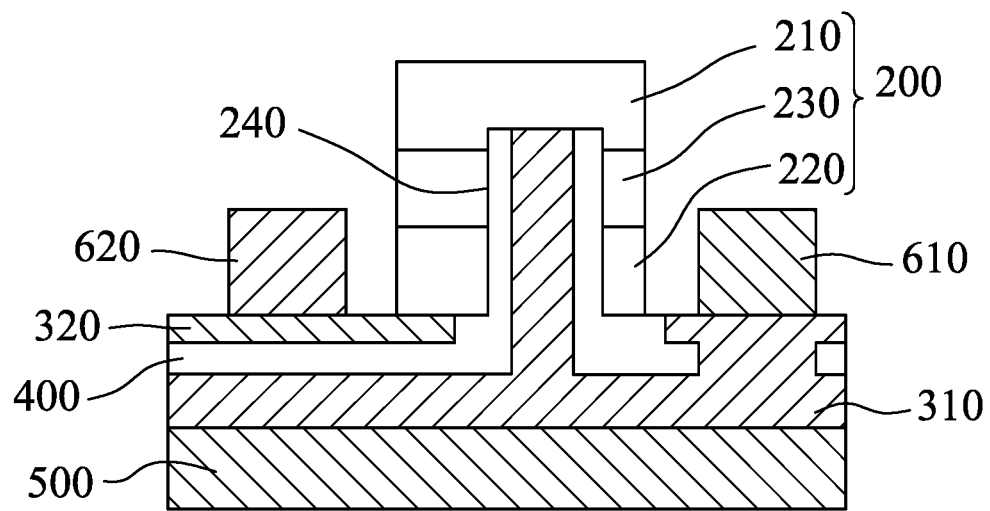
FIG. 5 is a schematic sectional view illustrating steps 8 and 9 of the first embodiment of the production method and a resultant first embodiment of a light emitting device according to the present disclosure.

Referring to FIG. 5, a first embodiment of a light emitting device according to the present disclosure includes a supporting substrate 500, a light emitting unit (with a first electrically conductive layer 310 as described below), a second electrically conductive layer 320, a first electrode 610, and a second electrode 620.

The light emitting unit includes the first electrically conductive layer 310, an insulating layer 400, and a semiconductor layer structure 200.

The first electrically conductive layer 310 has a conductive base portion that is disposed on the supporting substrate 500, a conductive protrusion portion that extends from the conductive base portion away from the supporting substrate 500, and a conductive connecting portion that extends from the conductive base portion away from the supporting substrate 500 and is spaced apart from the conductive protrusion portion. The conductive connecting portion has an exposed upper surface facing away from the supporting substrate 500 for the first electrode 610 to be disposed on and electrically connected to the first electrically conductive layer 310.

The insulating layer 400 has an insulating base portion that is disposed on the first electrically conductive layer 310 opposite to the supporting substrate 500, and an insulating protrusion portion that extends form the insulating base portion away from the supporting substrate 500. The insulating protrusion portion surrounds the conductive protrusion portion of the first electrically conductive layer 310.

The semiconductor layer structure 200, which is for light radiation, is disposed on the insulating layer 400 and the first electrically conductive layer 310 opposite to the supporting substrate 500, and includes a first-type semiconductor layer 210, an active layer 230, and a second-type semiconductor layer 220. The active layer 230 serves to emit light.

The term "first-type" refers to being doped with a first conductivity type dopant, and the term "second-type" refers to being doped with a second conductivity type dopant that is opposite in conductivity type to the first conductivity type dopant. For instance, the first conductivity type dopant may be a n-type dopant, and the second conductivity type dopant may be an p-type dopant, and vice versa. Therefore, the semiconductor layer structure 200 has a PN junction.

The second-type semiconductor layer 220, the active layer 230, and the first-type semiconductor layer 210 are sequentially disposed on the insulating base portion of the insulating layer 400 in such order. The semiconductor layer structure 200 has a recess 240 that extends from the second-type semiconductor layer 220 through the active layer 230 to the first-type semiconductor layer 210.

In this embodiment, the recess 240 completely penetrates the second-type semiconductor layer 220 and the active layer 230, and partially penetrates the first-type semiconductor layer 210 (i.e. a bottom surface of the first-type semiconductor layer 210 facing toward the supporting substrate 500 has an indentation). In other embodiments, the recess 240 may not penetrate the first-type semiconductor layer 210 (i.e. the bottom surface of the first-type semiconductor layer 210 may have no indentation).

The conductive protrusion portion of the first electrically conductive layer 310 and the insulating protrusion portion of the insulating layer 400 extend into the recess 240. Specifically, the conductive protrusion portion of the first electrically conductive layer 310 is disposed in contact with the bottom surface of the first-type semiconductor layer 210 for electrical connection. Furthermore, the insulating protrusion portion of the insulating layer 400 is disposed in contact with the bottom surface of the first electrically conductive layer 310, and over inner lateral surfaces of the active layer 230 and the second-type semiconductor layer 220. The inner lateral surface of the active layer 230 extends from the bottom surface of the first-type semiconductor layer 210, and the inner lateral surface of the second-type semiconductor layer 220 extends from the inner lateral surface of the active layer 230.

The active layer 230 may have multi-quantum wells (MQWs). Since light emitted therefrom exits through the first-type semiconductor layer 210, heat might accumulate in the first-type semiconductor layer 210. Nevertheless, the first electrically conductive layer 310 in contact with the first-type semiconductor layer 210 is able to effectively transfer and dissipate heat from the first-type semiconductor layer 210 to the supporting substrate 500.

The semiconductor layer structure 200 may be made from a III/V compound semiconductor material or a II/VI compound semiconductor material.

The III/V compound semiconductor material may at least contain a group-III element (e.g. Al, Ga, and In) and a group-V element (e.g. B, N, P, and As). Accordingly, as used herein, the term "III/V compound" covers a binary III/V compound, a ternary III/V compound, and a quaternary III/V compound, and refers to a compound having at least one Group-III element and at least one Group-V element. For instance, nitride compound semiconductor materials (e.g. GaN), arsenide compound semiconductor materials (e.g. GaAs), and phosphide compound semiconductor materials (e.g. InGaAlP) may be used. The III/V compound semiconductor material may be doped with one or more dopants other than the III/V compound, and may contain an additional component other than the III/V compound.

The semiconductor layer structure 200 may have a height ranging from 5 µm to 7 µm (in this embodiment), or a height that is larger than 7 µm and not larger than 8 µm.

The recess 240 may have a width that is not less than 15 µm and less than 32 µm, or a width ranging from 32 µm to 40 µm. It should be noted that since non-optimal reduction in the width of the recess 240 (i.e. non-optimal reduction in the width of the conductive the protrusion portion of first electrically conductive layer 310) and non-optimal increase of the number of the recess 240 might undesirably increase heat resistance, the width and number of the recess 240 should be optimally controlled. In this embodiment, the semiconductor layer structure 200 has one recess 240. However, in a variation of the first embodiment, the semiconductor layer structure 200 may have more than one recess 240 (e.g. see FIG. 6), for instance, 20 to 25 recesses 240 that have a width ranging from 34 µm to 36 µm.

The first-type semiconductor layer 210 may have a thickness not less than 2 µm (such as ranging from 2 µm to 3 µm), and a depth of the recess 240 from the active layer 230 to the first-type semiconductor layer 210 may be not less than 0.6 µm (e.g. not less than 1 µm). The larger the aforesaid depth of the recess 240, the more the conductive protrusion portion of the first electrically conductive layer 310 can be formed in the recess 240 to better dissipate heat from the first-type semiconductor layer 210.

The second electrically conductive layer 320 is disposed between the second-type semiconductor layer 220 and the insulating base portion of the insulating layer 400, and is disposed, to be specific, on the insulating base portion of the insulating layer 400 opposite to the conductive base portion of the first electrically conductive layer 310. The second electrically conductive layer 320 has a partially exposed upper surface facing away from the supporting substrate 500 for the second electrode 620 to be disposed on and electrically connected to the second electrically conductive layer 320. The upper surface of the second electrically conductive layer 320 is also electrically connected to the second-type semiconductor layer 220 in a direct contact manner.

The upper surface of the conductive connecting portion of the first electrically conductive layer 310 and the upper surface of the second electrically conductive layer 320 are flush with each other. Such flushness can be achieved (as described later) during formation of the first and second electrically conductive layers 310, 320.

A contact area between the conductive protrusion portion of the first electrically conductive layer 310 and the first-type semiconductor layer 210 is larger than 1.5% of an area of the bottom surface of the first-type semiconductor layer 210. For instance, the contact area may range from 2.3% to 2.8% of the area of the bottom surface, may be larger than 2.8% of the area of the bottom surface and smaller than 4% of the area of the bottom surface, or may range from 4% to 6% of the area of the bottom surface, for better enhancing the heat dissipation from the first-type semiconductor layer 210 and hence for producing a larger-size light emitting device or a high-voltage light emitting device.

The insulating layer 400 electrically insulates the first and second electrically conductive layers 310, 320 from each other. The electrical insulation as used herein does not mean that electrical connection is totally forbidden, and means that the first and second electrically conductive layers 310, 320 are not in direct electrical contact to prevent short circuits. The insulating layer 400 may be disposed partially over the first electrically conductive layer 310 to prevent reduction in the heat dissipation efficiency. The insulating layer 400 may be disposed partially or completely in contact with a lower surface of the second electrically conductive layer 320 facing toward the supporting substrate 500.

The insulating layer 400 may be made from a material selected from silicon oxide, silicon nitride, aluminum nitride, aluminum oxide, ceramic, and combinations thereof.

The supporting substrate 500 can dissipate heat, and may be made from a material selected from Si, Cu, ceramic, and combinations thereof. When the supporting substrate 500 is made from ceramic and hence has satisfactory heat dissipation efficiency, the supporting substrate 500 can cooperate with the first electrically conductive layer 310 to more efficiently transfer heat from the first electrically conductive layer 310. Moreover, since the supporting substrate 500, when made from ceramic, has insulating characteristics, a plurality of the light emitting units in series connection and/or in parallel connection (in other embodiments) may be formed on the supporting substrate 500 to produce a light emitting device operable under high voltage.

In this embodiment, the first electrically conductive layer 310 is in contact with the supporting substrate 500, such that the first electrically conductive layer 310 can transfer heat from the insulating layer 400 to the supporting substrate 500 which can in turn dissipate the heat.

The conductive base portion of the first electrically conductive layer 310 may be disposed totally or partially over the supporting substrate 500. The supporting substrate 500 can be more easily subjected to subsequent processing when the conductive base portion of the first electrically conductive layer 310 is disposed partially over the supporting substrate 500.

The first and second electrically conductive layers 310, 320 may be made from a metal material, for example, Ag, Au, Ti, Al, Cr, Pt, a TiW alloy, Ni, and combinations thereof. In this embodiment, a part of the conductive the first electrically connecting portion of conductive layer 310 in contact with the first electrode 610, as well as a part of the second electrically conductive layer 320 in contact with the second electrode 620, is made from Ti, Pt, Au, Cr, or a TiW alloy since these materials are more stable. Furthermore, in this embodiment, the conductive protrusion portion of the first electrically conductive layer 310 for filling the recess 240 is made from Al, Cr, or Ag since these materials are reflective materials.

The first and second electrically conductive layers 310, 320 may have a plurality of sublayers arranged vertically. For instance, the first electrically conductive layer 310 may include an ohmic contact sublayer, a metal reflective sublayer, a metal bonding sublayer, or combinations thereof, and the second electrically conductive layer 320 may include a transparent conductive sublayer, a metal reflective sublayer, a metal diffusion-blocking sublayer, an ohmic contact sublayer, or combinations thereof.

Regarding the first electrically conductive layer 310, the ohmic contact sublayer serves to establish satisfactory electrical connection with the first electrically conductive layer 310, and may be made from Cr, Ni, Au, Li, or combinations thereof. The metal reflective sublayer for the first electrically conductive layer 310 can reflect at least a portion of light emitted from the semiconductor layer structure 200 back to the semiconductor layer structure 200, and may be made from Ag. The metal bonding sublayer for the first electrically conductive layer 310 serves to establish satisfactory bonding to the supporting substrate 500, the insulating layer 400, and/or the first electrode 610, and may be made from Au.

In order to improve the contact between the semiconductor layer structure 200 and the first and second electrically conductive layers 310, 320 (i.e. in order to reduce the electrical resistance therebetween), a transparent contact layer (e.g. an ITO layer) may be provided therebetween. For instance, the semiconductor layer structure 200 may further include a transparent contact layer that is interposed between the first-type semiconductor layer 210 and the first electrically conductive layer 310, and/or a transparent contact layer that is interposed between the second-type semiconductor layer 220 and the second electrically conductive layer 320.

A part of the second electrically conductive layer 320 under the second-type semiconductor layer 220 may have a sublayer made from ITO for current spreading (i.e. the aforesaid transparent conductive sublayer), a sublayer made from Ag, Ni, or TiW for light reflection (i.e. the aforesaid metal reflective sublayer), a sublayer made from a stable metal material such as Ti, Pt, Au, Cr, or TiW for preventing undesired diffusion of the materials in the upper sublayers (i.e. the aforesaid metal diffusion-blocking sublayer), and a sublayer made from an ohmic contact material such as Cr, Ni, or Au (i.e. the aforesaid ohmic contact sublayer).

In this embodiment, the first and second electrodes 610, 620 are metal electrodes for wiring bonding. Namely, the first and second electrodes 610, 620 are electrical contact regions, and may be bond pads. In this embodiment, the first and second electrodes 610, 620 are disposed to on the same side of the light emitting device, and are respectively disposed adjacent to two opposite ends of the semiconductor layer structure 200 so as to prevent blocking of light emission from the semiconductor layer structure 200, and so as to facilitate wire bonding.

Figure 6:
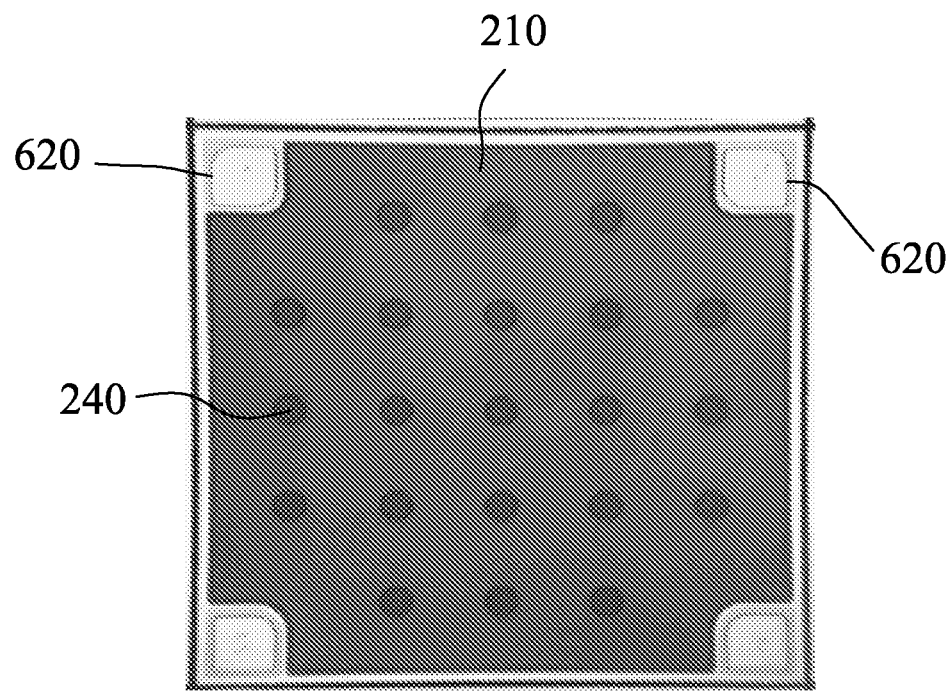
FIG. 6 is a schematic top view illustrating a variation of the first embodiment of the light emitting device.

Referring to FIG. 6, in the variation of the first embodiment, the plurality of the recesses 240 are uniformly distributed in the semiconductor layer structure 200. The first electrically conductive layer 310 has a plurality of the conductive protrusion portions that respectively extend into the recesses 240, and the insulating layer 400 has a plurality of the insluting protrusion portions that respectively extend into the recesses 240 and surround the conductive protrusion portions. The design shown in FIG. 6 enables the light emitting device of the present disclosure to have satisfactory current spreading and heat dissipating characteristics. The first and second electrodes 610, 620 are disposed adjacent to a periphery of the supporting substrate 500 to have the semiconductor layer structure 200 disposed therebetween.

A plurality of the light emitting devices in the first embodiment may be electrically connected to one another through wire bonding (e.g. using a gold bonding wire), and may be in series connection. Specifically, the first electrode 610 of a first one of the light emitting devices may be electrically connected with an external power source, the second electrode 620 of the first one of the light emitting devices may be electrically connected to the first electrode 610 of a second one of the light emitting devices, and so forth. The second electrode 620 of a last one of the light emitting devices is electrically connected to the external power source. Even though the plurality of the light emitting devices in series connection might have a higher operation voltage due to a fixed current provided by the external power source, these light emitting devices are still reliable under the high operation voltage due to their satisfactory stability demonstrated later.

A first embodiment of a production method according to the present disclosure is for producing the first embodiment of the light emitting device, and includes steps 1 to 9.

FIG. 1 illustrates steps 1 to 3.

In step 1, the semiconductor layer structure 200, which is an epitaxial layer structure, is formed on a growth substrate 100. The first-type semiconductor layer 210, the active layer 230, and the second-type semiconductor layer 220 are sequentially formed on the growth substrate 100 in such order. The semiconductor layer structure 200 may be formed using an epitaxial growth technique such as metal organic chemical vapor deposition (MOCVD).

In step 2, the recess 240 is formed in the semiconductor layer structure 200.

In step 3, the first and second electrically conductive layers 310, 320 are together formed over the second-type semiconductor layer 220 opposite to the active layer 230 and outside the recess 240, so that the first and second electrically conductive layers 310, 320 are currently at the same level (i.e. both on the second-type semiconductor layer 220). However, the first electrically conductive layer 310 is only partially formed. Further in step 3, the insulating layer 400 is formed over the first electrically conductive layer 310 and the second electrically conductive layer 320, and is formed in the recess 240 such that the insulating layer 400 is disposed over the bottom surface of the first-type semiconductor layer 210 and the inner lateral surfaces of the active layer 230 and the second-type semiconductor layer 220.

Figure 2:
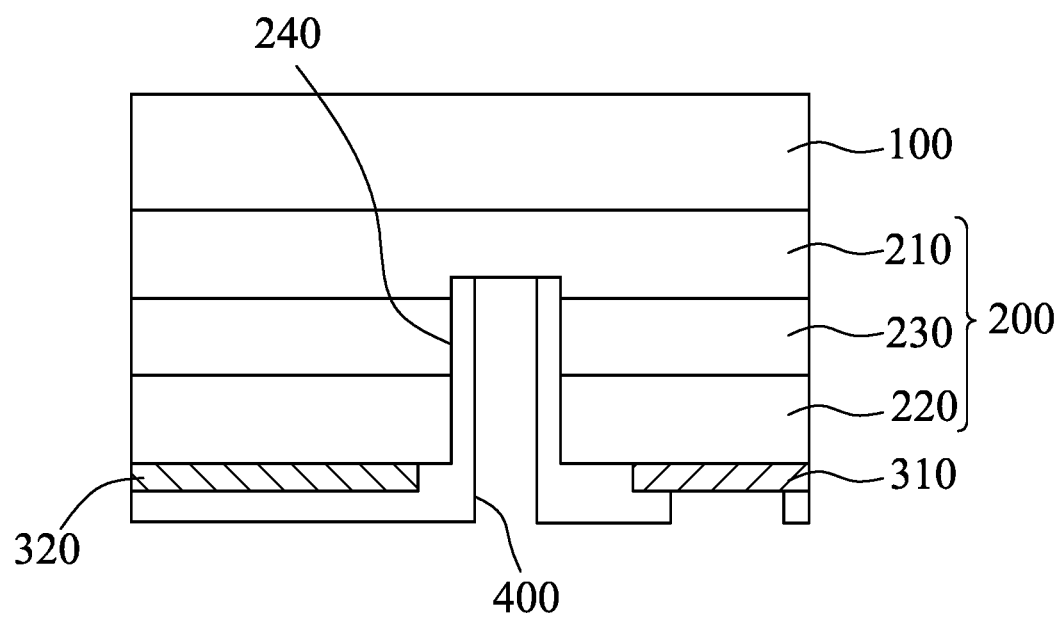

In step 4, as shown in FIG. 2, parts of the insulating layer 400 over the bottom surface of the first-type semiconductor layer 210 and the first electrically conductive layer 310 are removed to partially expose the first-type semiconductor layer 210 and the first electrically conductive layer 310, such that the insulating layer 400 has the insulating base portion and the insulating protrusion portion.

Figure 3:
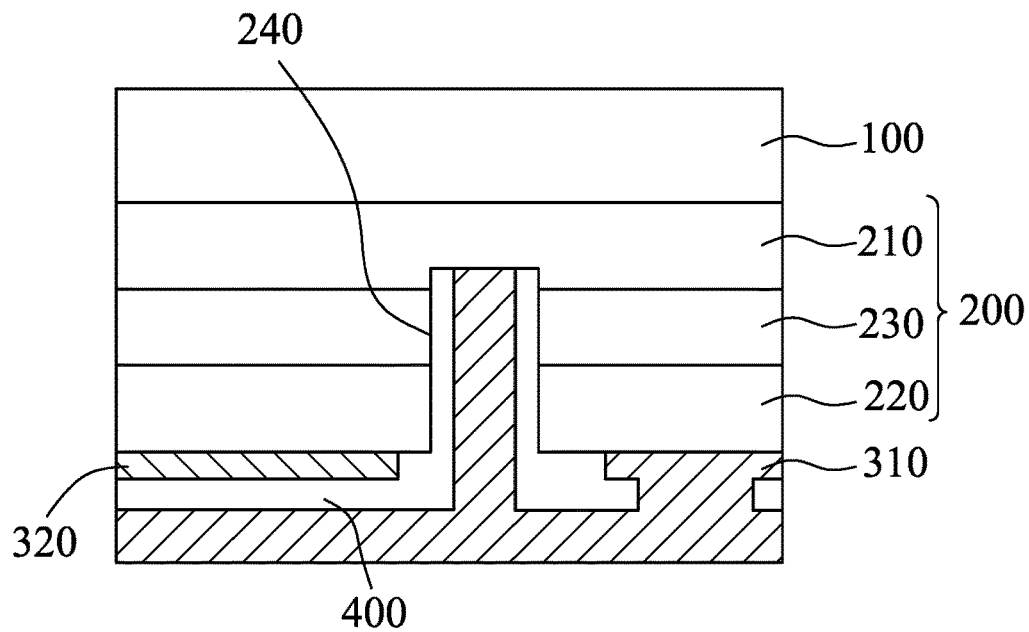

In step 5, as shown in FIG. 3, the first electrically conductive layer 310 is extended to be completely formed, such that the first electrically conductive layer 310 has the conductive base portion formed over the insulating base portion of the insulating layer 400, the conductive protrusion portion formed to be surrounded by the insulating protrusion portion of the insulating layer 400, and the conductive connecting portion formed to extend from the conductive base portion. The material for extending the first electrically conductive layer 310 may have a melting point lower than the bonding temperature to have a better flowability, and may contain, for example, Ni or Sn, such that the first electrically conductive layer 310 completely formed has less undesired voids and higher heat dissipation ability and greater stability.

Figure 4:
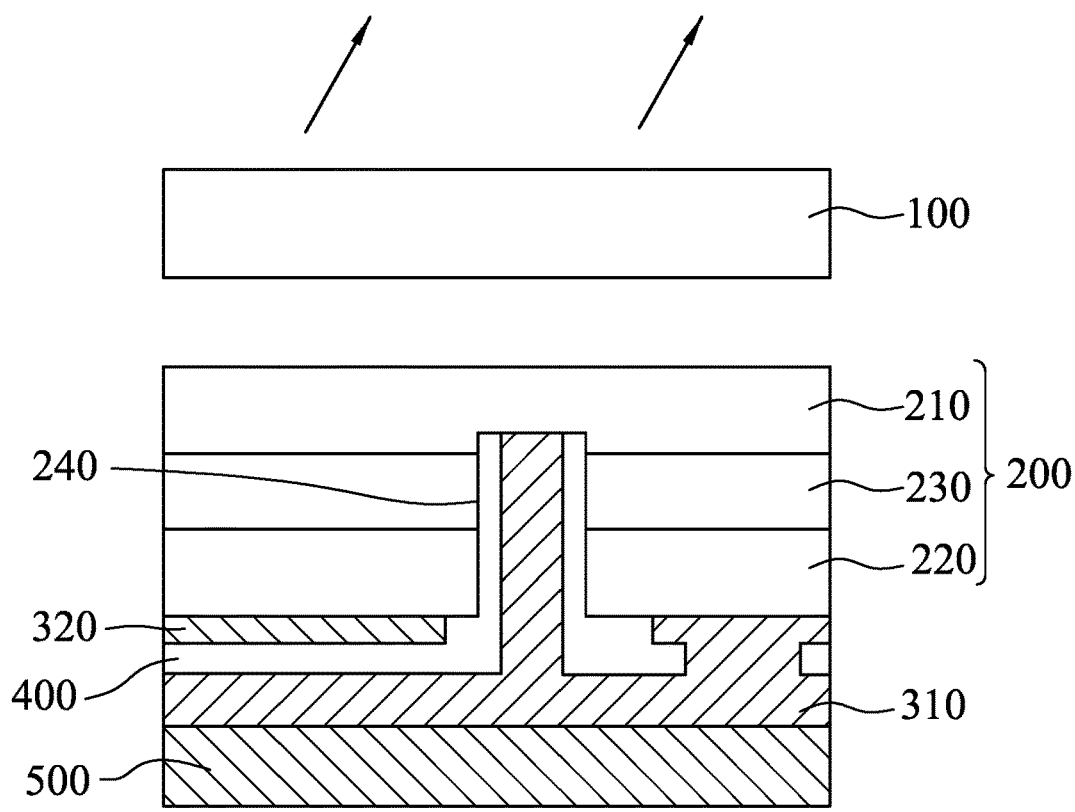

FIG. 4 illustrates steps 6 and 7.

In step 6, the supporting substrate 500 is disposed on and connected to a bottom surface of the conductive base portion of the first electrically conductive layer 310 which faces away from the growth substrate 100. Such connection may be achieved using a metal bonding technique or an adhesion technique. In the case of the metal bonding technique, a metal bonding layer may be formed between the conductive base portion of the first electrically conductive layer 310 and the supporting substrate 500.

In step 7, the growth substrate 100 is removed.

FIG. 5 illustrates steps 8 and 9.

In step 8, the semiconductor layer structure 200 is partially removed, such that the first electrically conductive layer 310 and the second electrically conductive layer 320 are partially exposed, and such that the contact area between the conductive protrusion portion of the first electrically conductive layer 310 and the first-type semiconductor layer 210 is as described above. Since the semiconductor layer structure 200 can be directly etched to conduct the partial removal thereof for later disposition of the electrodes, the insulating layer 400 and the first and second electrically conductive layers 310, 320 are not required to be removed, simplifying and facilitating the production method.

In step 9, the first electrode 610 is formed on the exposed upper surface of the conductive connecting portion of the first electrically conductive layer 310, and the second electrode 620 is formed on the exposed upper surface of the second electrically conductive layer 320.

Figure 7:
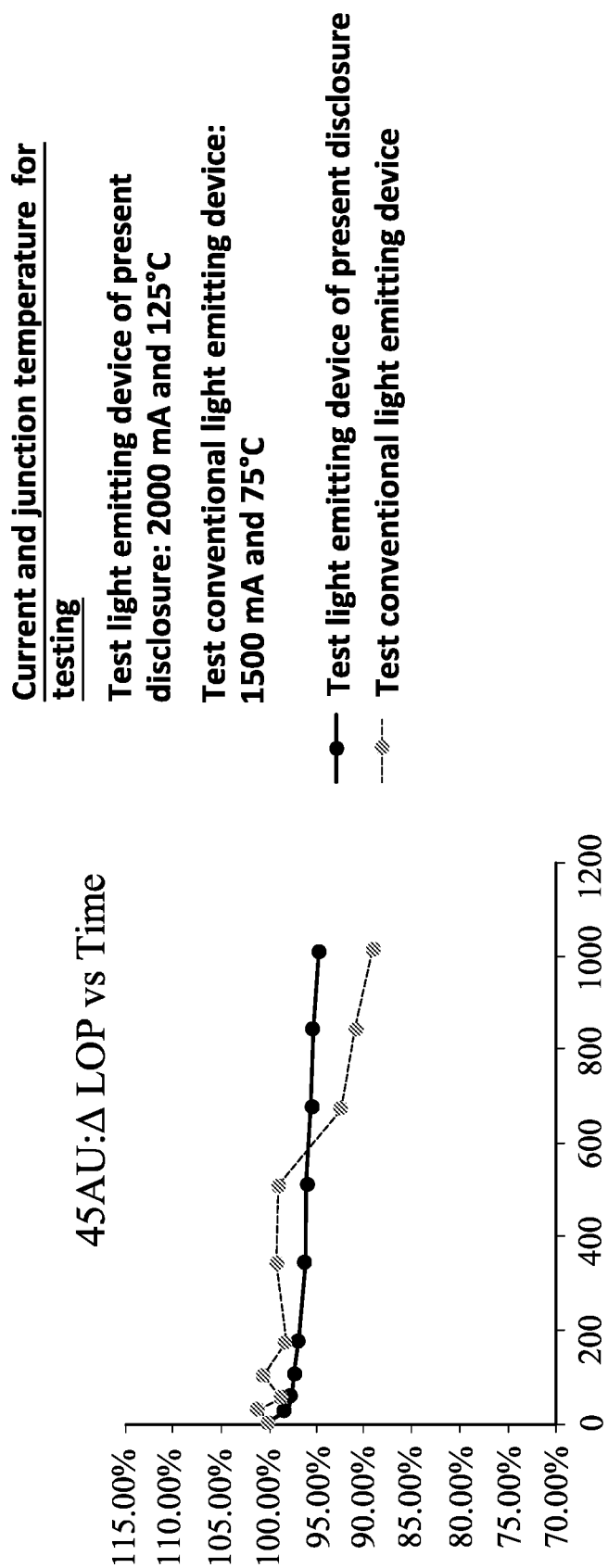
FIGS. 7 to 9 are graphs respectively illustrating the change in light output power (ΔLOP) versus time, the change in forward voltage (ΔVF) versus time, and the change in leakage current (ΔIR) versus time regarding a test light emitting device of the present disclosure and a test conventional light emitting device, wherein the test light emitting device of the present disclosure was tested at a junction temperature ($T_j$) of 125° C. and a current of 2000 mA, the test conventional light emitting device was tested at a junction temperature of 75° C. and under a current of 1500 mA, and "AU" represents gold-series.
Figure 8:
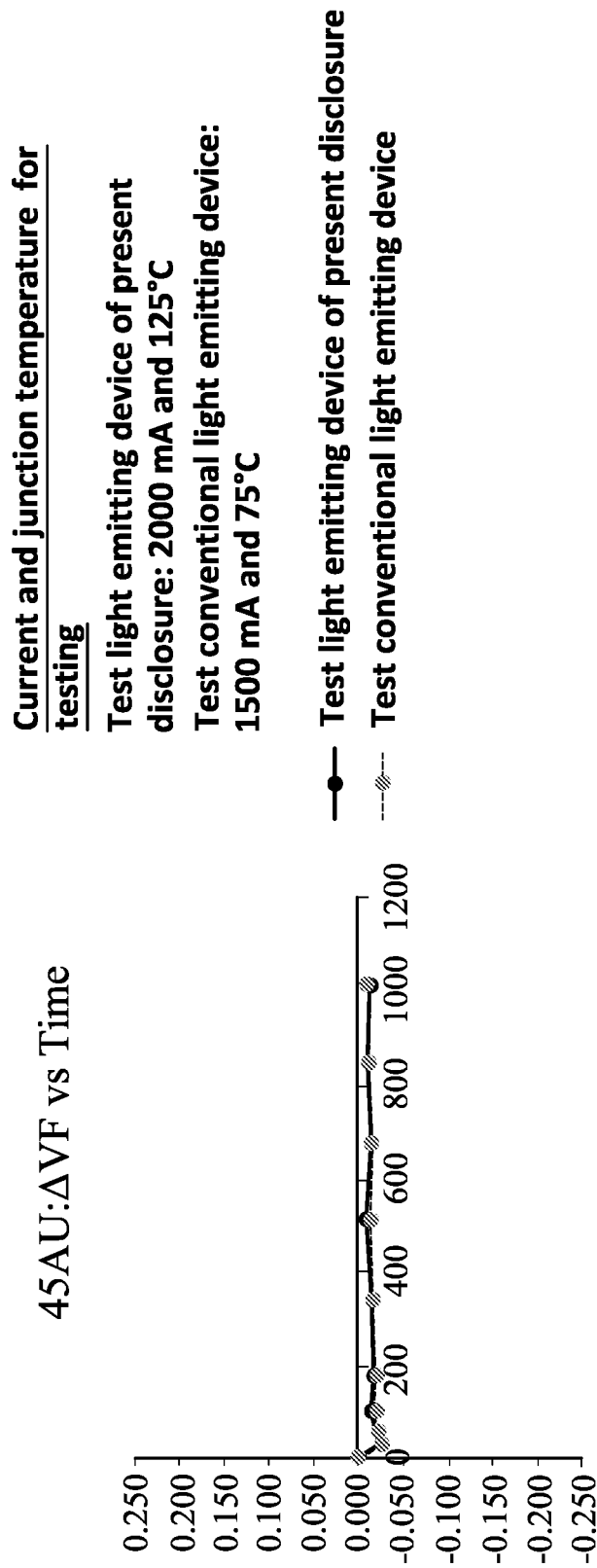
Figure 9:
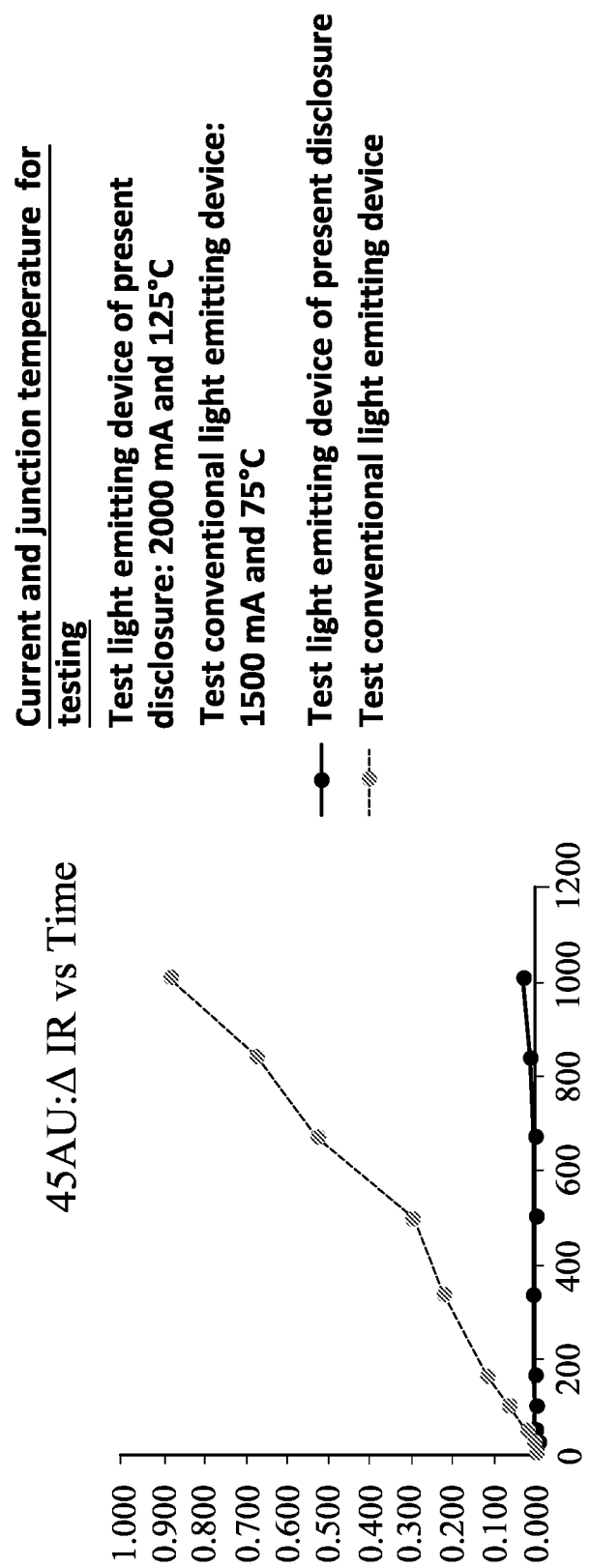

Referring to FIGS. 7 to 9, a first aging test at a junction temperature ($T_j$) was conducted to evaluate the difference between a test light emitting device of the present disclosure (the first embodiment) and a test conventional light emitting device. The test conventional light emitting device (with a conventional arrangement for a first electrically conductive layer and a semiconductor layer structure) is different from the test light emitting device of the present disclosure in that: the test conventional light emitting device does not have a recess formed in the semiconductor layer structure and the first electrically conductive layer protruding into the recess to be in contract with a first-type semiconductor layer of the semiconductor layer structure, and also does not have a specific contact area between the first electrically conductive layer and the first-type semiconductor layer as applied in the present disclosure. Since it had been previously determined that the test conventional light emitting device underwent rapid failure at a junction temperature of 125° C. and under a current of 2000 mA, the test light emitting device of the present disclosure was subjected to the first aging test under more unfavorable conditions (the junction temperature of 125° C. and the current of 2000 mA) compared to the test conventional light emitting device (which was subjected to the first aging test at a junction temperature of 75° C. and under a current of 1500 mA), so as to more certainly ensure whether the test light emitting device of the present disclosure is more reliable than the test conventional light emitting device.

As shown in FIG. 7, during 1000 hours of testing, the test light emitting device of the present disclosure had a change in light output power ($\Delta$LOP) which had less fluctuation than that of the test conventional light emitting device. Particularly, the degree of the change in light output power was still small for the test light emitting device of the present disclosure after 600 hours of testing, which was not the case for the test conventional light emitting device. Therefore, the test light emitting device of the present disclosure is more stable in light output.

As shown in FIG. 8, during 1000 hours of testing, the test light emitting device of the present disclosure, even under the more unfavorable conditions, was still comparable to the test conventional light emitting device in terms of the change in forward voltage ($\Delta$VF) which is the difference from the initial forward voltage.

As shown in FIG. 9, during 1000 hours of testing, the test light emitting device of the present disclosure had a change in leakage current ($\Delta$IR) of nearly zero, indicating that the test light emitting device of the present disclosure substantially had no current leakage. However, the test conventional light emitting device had a change in leakage current that increased with time to a considerable degree.

In view of the test results shown in FIGS. 7 to 9, it can be concluded that the light emitting device of the present disclosure has satisfactory stability and reliability at a high temperature and a large current density.

Figure 10:
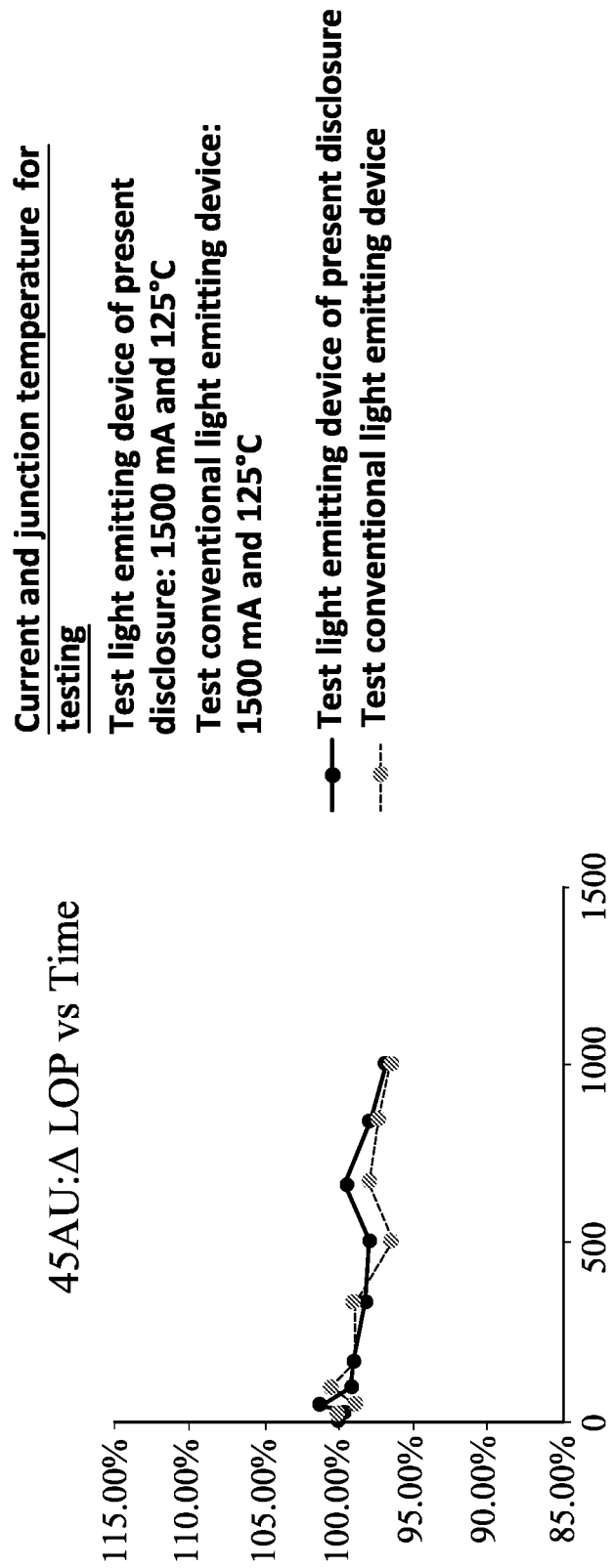
FIGS. 10 to 12 are graphs respectively illustrating the change in light output power (ΔLOP) versus time, the change in forward voltage (ΔVF) versus time, and the change in leakage current (ΔIR) versus time regarding a test light emitting device of the present disclosure and a test conventional light emitting device, wherein the test light emitting device of the present disclosure and the test conventional light emitting device were tested at a junction temperature ($T_j$) of 125° C. and a current of 1500 mA, and "AU" represents gold-series.
Figure 11:
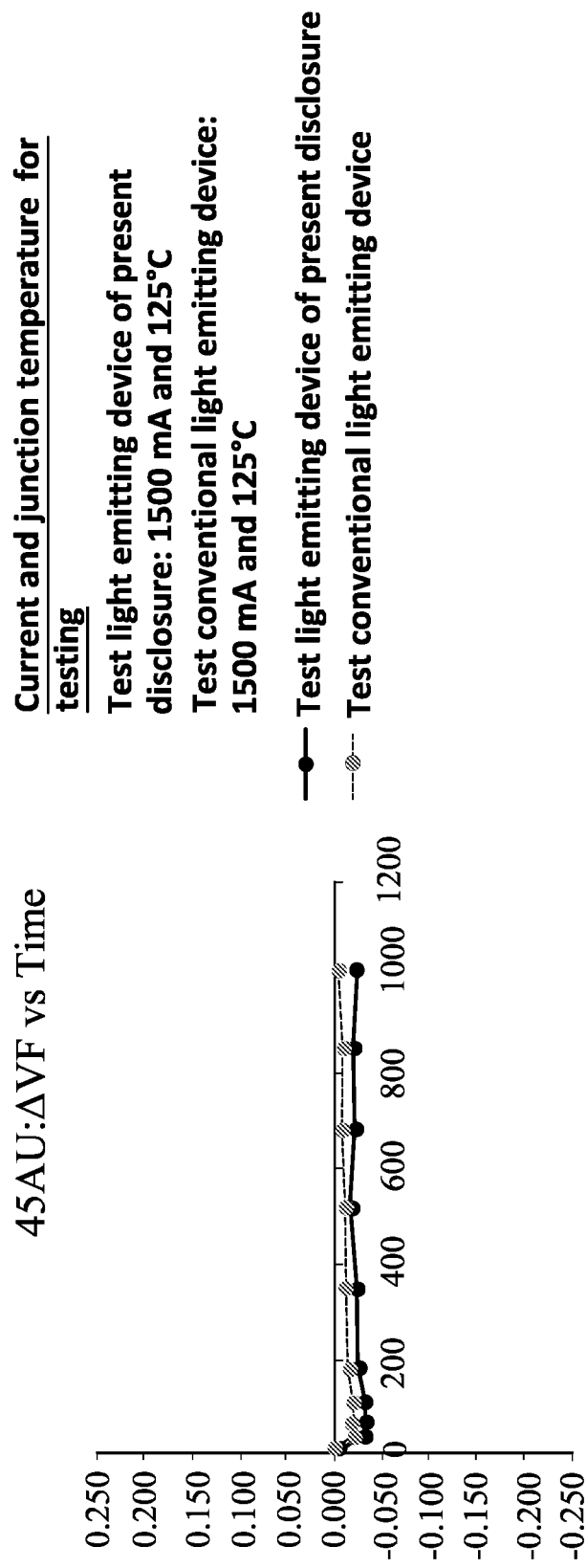
Figure 12:
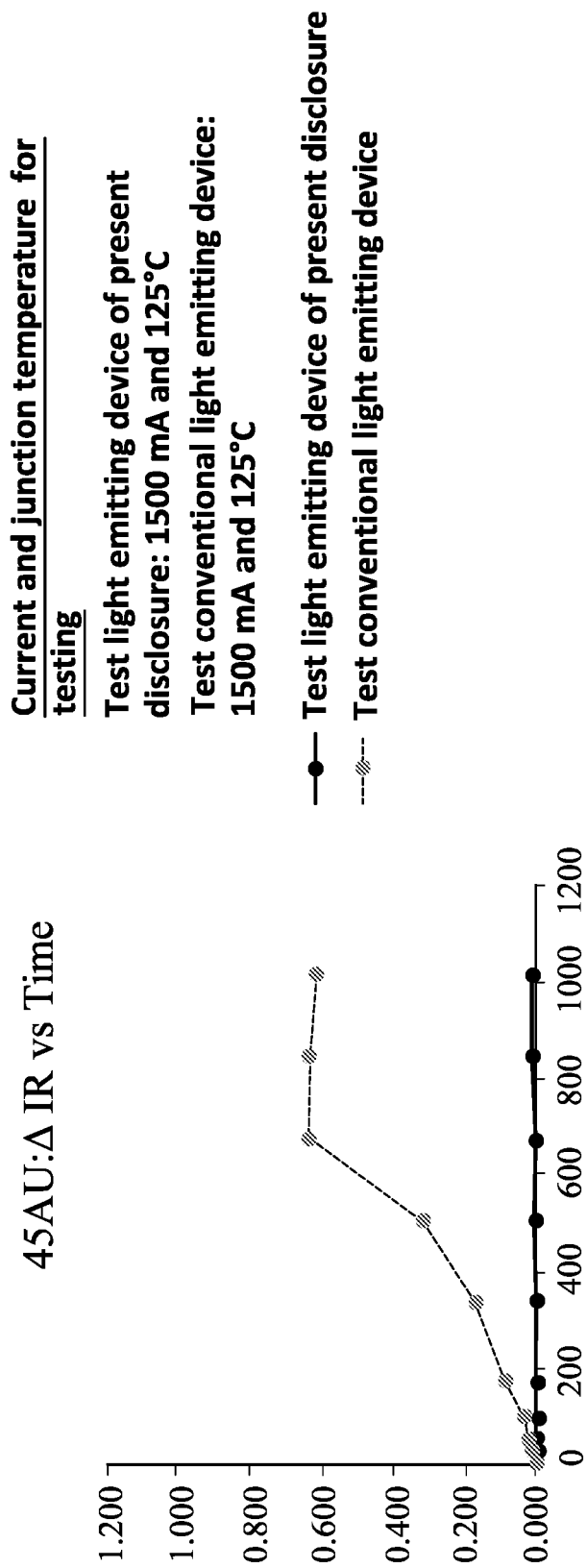

Referring to FIGS. 10 to 12, a second aging test at a junction temperature was conducted to evaluate the difference between the test light emitting device of the present disclosure and the test conventional light emitting device. In the second aging test, both the test light emitting device of the present disclosure and the test conventional light emitting device were evaluated at a junction temperature of 125° C. and under a current of 1500 mA.

As shown in FIGS. 10 and 11, during 1000 hours of testing, the test light emitting device of the present disclosure and the test conventional light emitting device were similar in the change in light output power and the change in forward voltage. As shown in FIG. 12, during 1000 hours of testing, the test light emitting device of the present disclosure had a change in leakage current ($\Delta$IR) of nearly zero, indicating that the test light emitting device of the present disclosure substantially had no current leakage. However, the test conventional light emitting device had a change in leakage current that increased with time to a considerable degree. In view of these test results, it can be concluded that the light emitting device of the present disclosure has satisfactory stability and reliability at a high temperature and a medium or large current density.

Figure 17:
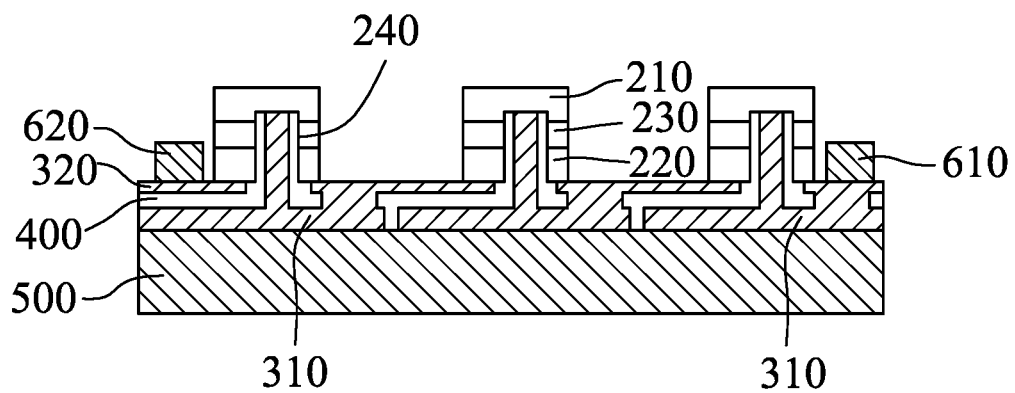
FIG. 17 is a schematic sectional view illustrating steps 7 to 9 of the second embodiment of the production method and a resultant second embodiment of the light emitting device according to the present disclosure.

Referring to FIG. 17, a second embodiment of the light emitting device according to the present disclosure is generally similar to the first embodiment of the light emitting device, except for the following differences.

The light emitting device further includes a plurality of the light emitting units in series connection (only three shown in the drawing). The number of the light emitting units may range from 3 to 6 or 7 to 9.

The semiconductor layer structures 200 of the light emitting units are spaced apart from one another. The second electrically conductive layer 320 is disposed on the insulating base portion of the insulating layer 400 of one of the light emitting units opposite to the first electrically conductive layer 310 of the one of the light emitting units. The second electrically conductive layer 320 is electrically connected to the lower surface of the second-type semiconductor layer 220 of the semiconductor layer structure of the one of the light emitting units. The lower surface of the second-type semiconductor layer 220 is opposite to the active layer 230 of the semiconductor layer structure 200 of the one of the light emitting units. The first electrode 610 is disposed on and electrically connected to the conductive connecting portion of the first electrically conductive layer 310 of another one of the light emitting units. The semiconductor layer structures 200 of two adjacent ones of the light emitting units are electrically connected to each other through the corresponding conductive connecting portion. By virtue of the first electrically conductive layers 320 of the light emitting units and the second electrically conductive layer 320, the light emitting units are in series connection.

The insulating layer 400 of each of the light emitting units separates the first electrically conductive layer 310 of a same one of the light emitting units from the second electrically conductive layer 320 or the first electrically conductive layer 310 of a different one of the light emitting units.

In this embodiment, the upper surfaces of the conductive connecting portions of the first electrically conductive layers 310 belonging to some of the light emitting units are partially exposed (namely, partially covered respectively by the second-type semiconductor of the layers 220 corresponding semiconductor layer structures 220 for electrical connection thereto). The first electrode 610 is not disposed on these partially exposed upper surfaces, but is disposed on the completely exposed upper surface of the conductive connective portion that is not disposed between any two spaced-apart semiconductor layer structures 200.

In this embodiment, the height of the semiconductor layer structures 200 is not larger than 7 μm.

When the first and second electrodes 610, 620 are disposed adjacent to the periphery of the supporting substrate 500, light emitted from the light emitting units can be prevented from being blocked by the first and second electrodes 610, 620 and can be concentrated more effectively.

Referring to FIGS. 13 to 17, a second embodiment of the production method according to the present disclosure is for producing the second embodiment of the light emitting device, and is generally similar to the first embodiment of the production method, except for the following differences.

Figure 13:
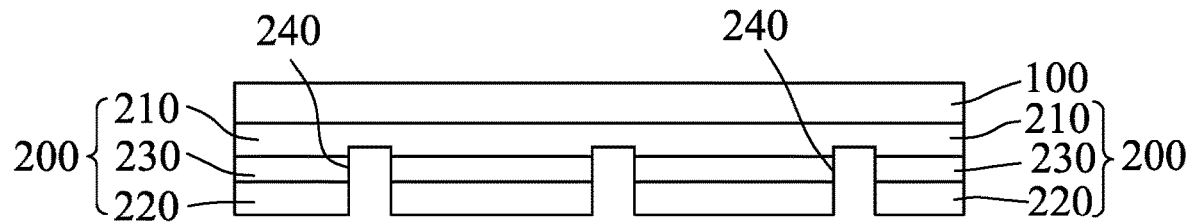
FIGS. 13 to 16 are schematic sectional views illustrating steps 1 to 6 of a second embodiment of the production method according to the present disclosure.

FIG. 13 illustrates steps 1 and 2.

A plurality of the semiconductor layer structures 200 are formed and are connected to one another in step 1. A plurality of the recesses 240 are formed respectively in the semiconductor layer structures 200 through wet etching or dry etching in step 2.

Figure 14:
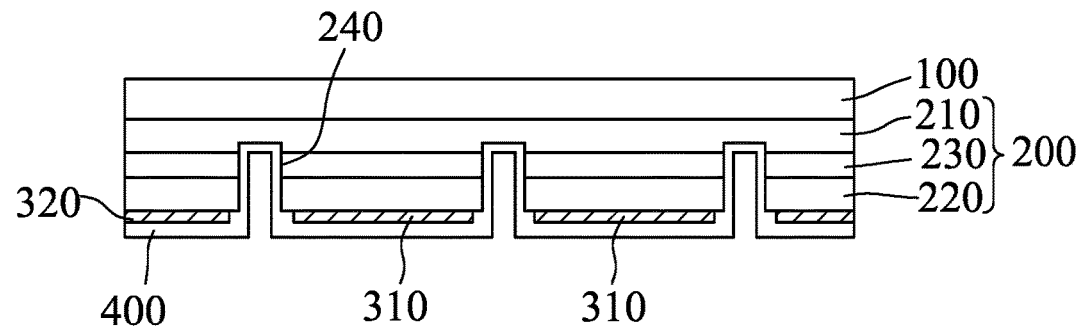

In step 3, as shown in FIG. 14, a plurality of the first electrically conductive layers 310 are partially formed respectively over the second-type semiconductor layers 220 of the semiconductor layer structures 200, and the second electrically conductive layer 320 is formed over the second-type semiconductor layer 220 of one of the semiconductor layer structures 200. The first electrically conductive layers 310 and the second electrically conductive layer 320 are flush with one another. Further in step 3, a plurality of the insulating layers 400 are formed respectively over the first electrically conductive layers 310 and in the recesses 240. One of the insulating layers 400 is formed over the second electrically conductive layer 320.

Figure 15:
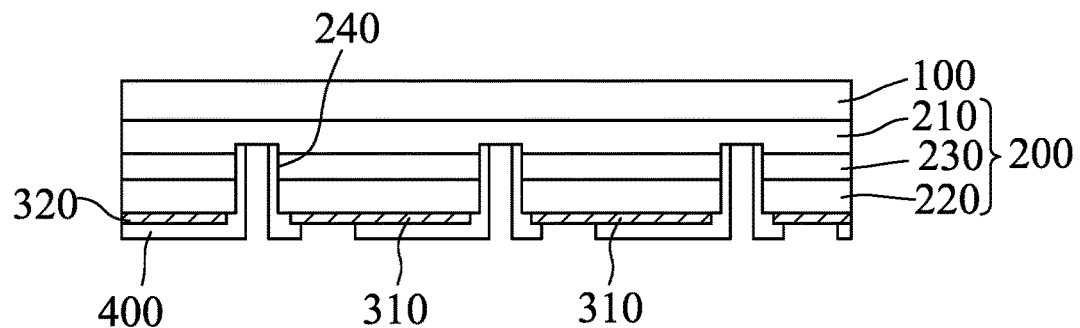

In step 4, as shown in FIG. 15, the parts of the insulating layers 400 respectively over the bottom surfaces of the first-type semiconductor layers 210 and the first electrically conductive layers 310 are partially removed, such that the insulating layers 400 are separated from each other.

Figure 16:
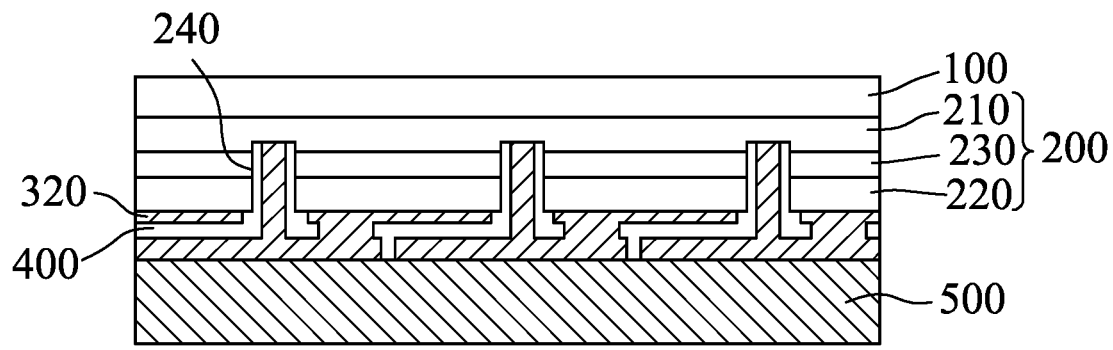

FIG. 16 illustrates steps 5 and 6.

In step 5, the first electrically conductive layers 310 are extended, such that two adjacent ones of the first electrically conductive layers 310 are separated from each other by a corresponding one of the insulating layers 400. In step 6, the supporting substrate 500 is disposed on the conductive base portions of the first electrically conductive layers 310.

FIG. 17 illustrates steps 7 to 9.

In step 7, the removal of the growth substrate 100 can be achieved by totally removing the growth substrate 100 or reducing the thickness of the growth substrate 100. In step 8, the semiconductor layer structures 200 are partially removed so as to separate the semiconductor layer structures 200 from one another and respectively partially expose the first electrically conductive layers 310. In step 9, the first electrode 610 is formed to be electrically connected to one of the first electrically conductive layers 310.

Figure 18:
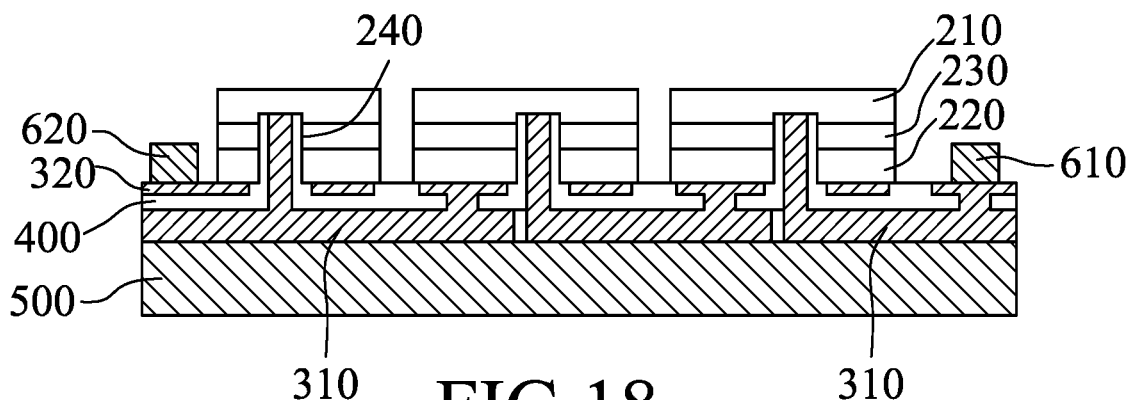
FIG. 18 is a schematic sectional view illustrating a third embodiment of the light emitting device according to the present disclosure.

Referring to FIG. 18, a third embodiment of the light emitting device and the production method thereof according to the present disclosure is generally similar to the second embodiment of the light emitting device and the production method thereof, except for the following differences.

The conductive connecting portions of the first electrically conductive layers 310 of most of the light emitting units are under and covered respectively by the semiconductor layer structures 200 of the adjacent ones of the light emitting units. Furthermore, each of the insulating layers 400 is partially exposed to an optimal extent between the two adjacent ones of the semiconductor layer structures 200, or between one of the semiconductor layer structures 200 and the first electrode 610. By virtue of such arrangement, the conductive connecting portions of the first electrically conductive layers 310 can be protected from being damaged from outside.

To achieve the aforesaid arrangement of the conductive connecting portions of the first electrically conductive layers 310, the locations for forming the first electrically conductive layers 310 and the insulating layers 400 are accordingly adjusted in step 3, and the semiconductor layer structures 200 are partially removed to partially expose the insulating layers 400 to the optimal extent and not to expose the conductive connecting portions of the first electrically conductive layers 310 in step 8.

The advantages of the light emitting device and the production method thereof according to the present disclosure reside in the following.

First of all, since the first electrically conductive layer 310 is disposed in contact with both the supporting substrate 500 and the bottom surface of the first-type semiconductor layer 210, and since the contact area between the conductive protrusion portion of the first electrically conductive layer 310 and the first-type semiconductor layer 210 is larger than 1.5% of the area of the bottom surface of the first-type semiconductor layer 210, heat in the semiconductor layer structure 200 (particularly heat in the first-type semiconductor layer 210) can be effectively and efficiently transferred to the supporting substrate 500 for further heat dissipation. Thus, the light emitting device of the present disclosure is stable in light output and has satisfactory endurance, being reliable.

Due to its excellent heat dissipation efficiency, the light emitting device of the present disclosure can serve as an ultraviolet (UV) light emitting device since ultraviolet light is more easily absorbed by a semiconductor layer structure.

Moreover, the light emitting device of the present disclosure able to efficiently dissipate heat can serve as a high-voltage light emitting device.

Secondly, the first and second electrodes 610, 620 are disposed on the same side, facilitating electrical connection to an external power source.

Thirdly, since a plurality of the first electrically conductive layers 310 can be electrically connected to a plurality of the semiconductor layer structures 200 through a plurality of the recesses 240 for achieving uniform current distribution, a plurality of the light emitting units can be arranged in series connection and/or parallel connection. Therefore, the light emitting device of the present disclosure can serve as a high-voltage component and is suitable for chip on board packaging.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A light emitting device comprising:
   a supporting substrate;
   at least one light emitting unit including
      a first electrically conductive layer having a conductive base portion that is disposed on said supporting substrate, and a conductive protrusion portion that extends from said conductive base portion away from said supporting substrate,
      an insulating layer having an insulating base portion that is disposed on said first electrically conductive layer opposite to said supporting substrate, and an insulating protrusion portion that extends form said insulating base portion away from said supporting substrate, said insulating protrusion portion surrounding said conductive protrusion portion of said first electrically conductive layer, and
      a semiconductor layer structure disposed on said insulating layer and said first electrically conductive layer opposite to said supporting substrate, and including a first-type semiconductor layer, an active layer, and a second-type semiconductor layer, said second-type semiconductor layer, said active layer, and said first-type semiconductor layer being sequentially disposed on said insulating base portion of said insulating layer in such order, said semiconductor layer structure having at least one recess that extends from said second-type semiconductor layer through said active layer to said first-type semiconductor layer, said conductive protrusion portion of said first electrically conductive layer and said insulating protrusion portion of said insulating layer extending into said recess, said conductive protrusion portion of said first electrically conductive layer being disposed in contact with a bottom surface of said first-type semiconductor layer facing toward said supporting substrate;
   a second electrically conductive layer disposed on said insulating base portion of said insulating layer opposite to said first electrically conductive layer, said second electrically conductive layer being electrically connected with said semiconductor layer structure;
   a first electrode electrically connected to said first electrically conductive layer; and
   a second electrode electrically connected to said second electrically conductive layer,
   wherein a contact area between said conductive protrusion portion of said first electrically conductive layer and said first-type semiconductor layer is larger than 1.5% of an area of said bottom surface of said first-type semiconductor layer.

2. The light emitting device as claimed in claim 1, further comprising a plurality of said light emitting units, said semiconductor layer structures of said light emitting units being spaced apart from each other, said second electrically conductive layer being disposed on said insulating base portion of said insulating layer of one of said light emitting units opposite to said first electrically conductive layer of said one of said light emitting units, said second electrically conductive layer being electrically connected to a lower surface of said second-type semiconductor layer of said semiconductor layer structure of said one of said light emitting units, said lower surface of said second-type semiconductor layer being opposite to said active layer of said semiconductor layer structure of said one of said light emitting units, said first electrode being electrically connected to said first electrically conductive layer of another one of said light emitting units, said first electrically conductive layer of each of said light emitting units further having a conductive connecting portion that extends from said conductive base portion away from said supporting substrate and is spaced apart from said conductive protrusion portion, said semiconductor layer structures of two adjacent ones of said light emitting units being electrically connected to each other through said conductive connecting portion, said insulating layer of each of said light emitting units separating said first electrically conductive layer of a same one of said light emitting units from one of said second electrically conductive layer and said first electrically conductive layer of a different one of said light emitting units.

3. The light emitting device as claimed in claim 2, wherein said conductive connecting portion of said first electrically conductive layer of each of said light emitting units is partially exposed.

4. The light emitting device as claimed in claim 2, wherein said conductive connecting portion of said first electrically conductive layer of at least one of said light emitting units is under and covered by said semiconductor layer structure of an adjacent one of said light emitting units.

5. The light emitting device as claimed in claim 2, wherein said light emitting units are identical in structure.

6. The light emitting device as claimed in claim 2, wherein said semiconductor layer structures of said light emitting units are formed through a growth process with a growth substrate.

7. The light emitting device as claimed in claim 1, wherein said contact area between said conductive protrusion portion of said first electrically conductive layer and said first-type semiconductor layer is not less than 4% of said area of said bottom surface of said first-type semiconductor layer and is not greater than 6% of said area of said bottom surface of first-type semiconductor layer.

8. The light emitting device as claimed in claim 1, wherein at least one of said first electrically conductive layer or said second electrically conductive layers is made from a metal material.

9. The light emitting device as claimed in claim 1, wherein said semiconductor layer structure has a height that is not larger than 7 μm.

10. The light emitting device as claimed in claim 1, wherein said supporting substrate is made from a ceramic material.

11. The light emitting device as claimed in claim 2, wherein said first electrically conductive layer of one of said two adjacent ones of said light emitting units is separated from said first electrically conductive layer of the other one of said two adjacent ones of said light emitting units by said insulating layer of the other one of said two adjacent ones of said light emitting units.

12. The light emitting device as claimed in claim 1, wherein said first and second electrodes are disposed adjacent to a periphery of said supporting substrate.

13. The light emitting device as claimed in claim 1, wherein said conductive base portion of said first electrically conductive layer, said insulating base portion of said insulating layer, and said second electrically conductive layer are sequentially disposed on said supporting substrate in such order.

14. The light emitting device as claimed in claim 2, wherein an amount of said light emitting units ranges from 3 to 9.

15. The light emitting device as claimed in claim 1, wherein said first electrically conductive layer of said light emitting unit further has a conductive connecting portion that extends from said conductive base portion of said first electrically conductive layer away from said supporting substrate and is spaced apart from said conductive protrusion portion of said first electrically conductive layer, said first electrode being disposed on said conductive connecting portion.

* * * * *